United States Patent
Lanzillo et al.

(10) Patent No.: US 12,550,713 B2
(45) Date of Patent: Feb. 10, 2026

(54) HYBRID BURIED POWER RAIL STRUCTURE WITH DUAL FRONT SIDE AND BACKSIDE PROCESSING

(71) Applicant: INTERNATIONAL BUSINESS MACHINES CORPORATION, Armonk, NY (US)

(72) Inventors: Nicholas Anthony Lanzillo, Wynantskill, NY (US); Hosadurga Shobha, Niskayuna, NY (US); Huai Huang, Clifton Park, NY (US); Ruilong Xie, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 772 days.

(21) Appl. No.: 17/810,317

(22) Filed: Jun. 30, 2022

(65) Prior Publication Data
US 2024/0006314 A1    Jan. 4, 2024

(51) Int. Cl.
| H01L 23/528 | (2006.01) |
| H01L 21/768 | (2006.01) |
| H01L 23/535 | (2006.01) |
| H10D 84/01 | (2025.01) |
| H10D 84/03 | (2025.01) |

(52) U.S. Cl.
CPC .... *H01L 23/5286* (2013.01); *H01L 21/76898* (2013.01); *H01L 23/535* (2013.01); *H10D 84/0186* (2025.01); *H10D 84/038* (2025.01)

(58) Field of Classification Search
CPC ............... H01L 23/5286; H01L 23/535; H01L 21/76898; H10D 84/0186; H10D 84/038
See application file for complete search history.

(56) References Cited

U.S. PATENT DOCUMENTS

| 6,492,244 | B1 | 12/2002 | Christensen et al. |
| 10,276,499 | B2 | 4/2019 | Peng |
| 10,475,692 | B2 | 11/2019 | Licausi et al. |
| 10,636,739 | B2 | 4/2020 | Beyne et al. |
| 10,700,207 | B2 | 6/2020 | Chen et al. |
| 10,872,818 | B2 | 12/2020 | Chiang et al. |
| 10,886,224 | B2 | 1/2021 | Gerousis et al. |

(Continued)

FOREIGN PATENT DOCUMENTS

| CN | 107026146 A | 8/2017 |
| WO | 2024/002268 A1 | 1/2024 |

OTHER PUBLICATIONS

Imec, "A View on the Logic Technology Roadmap"; Sep. 22, 2022, Retrieved from https://www.imec-int.com/en/articles/view-logic-technologyroadmap; 75 pgs.

(Continued)

*Primary Examiner* — Mark W Tornow
(74) *Attorney, Agent, or Firm* — L. Jeffrey Kelly

(57) ABSTRACT

A semiconductor device includes a semiconductor substrate having a top surface and a bottom surface. An electronic device is integrated into the top surface of the semiconductor substrate. A conductive power rail is positioned intermediate the top surface and the bottom surface of the semiconductor substrate. The conductive power rail is configured to conduct power to the electronic device.

18 Claims, 11 Drawing Sheets

(56) References Cited

U.S. PATENT DOCUMENTS

| | | | |
|---|---|---|---|
| 11,233,008 | B2 | 1/2022 | Hong et al. |
| 11,257,764 | B2 | 2/2022 | Hiblot et al. |
| 2018/0019207 | A1 | 1/2018 | Peng et al. |
| 2018/0294267 | A1 | 10/2018 | Licausi et al. |
| 2020/0098681 | A1 | 3/2020 | Kim et al. |
| 2020/0105671 | A1 | 4/2020 | Lai et al. |
| 2020/0266169 | A1 | 8/2020 | Kang et al. |
| 2020/0373242 | A1* | 11/2020 | Hiblot .................. H10D 30/021 |
| 2021/0296234 | A1 | 9/2021 | Dechene et al. |
| 2021/0305381 | A1 | 9/2021 | Chiang et al. |
| 2021/0343646 | A1 | 11/2021 | Chen et al. |
| 2022/0157957 | A1 | 5/2022 | Jin et al. |
| 2022/0181258 | A1* | 6/2022 | Liebmann .............. H10D 30/67 |
| 2023/0074159 | A1* | 3/2023 | Lin ..................... H01L 23/5286 |
| 2023/0178542 | A1* | 6/2023 | Gossner .............. H10D 89/921 |
| | | | 257/398 |

OTHER PUBLICATIONS

International Search Report and Written Opinion issued Sep. 15, 2023 in related International Patent Application No. PCT/CN2023/104034; 9 pgs.

\* cited by examiner

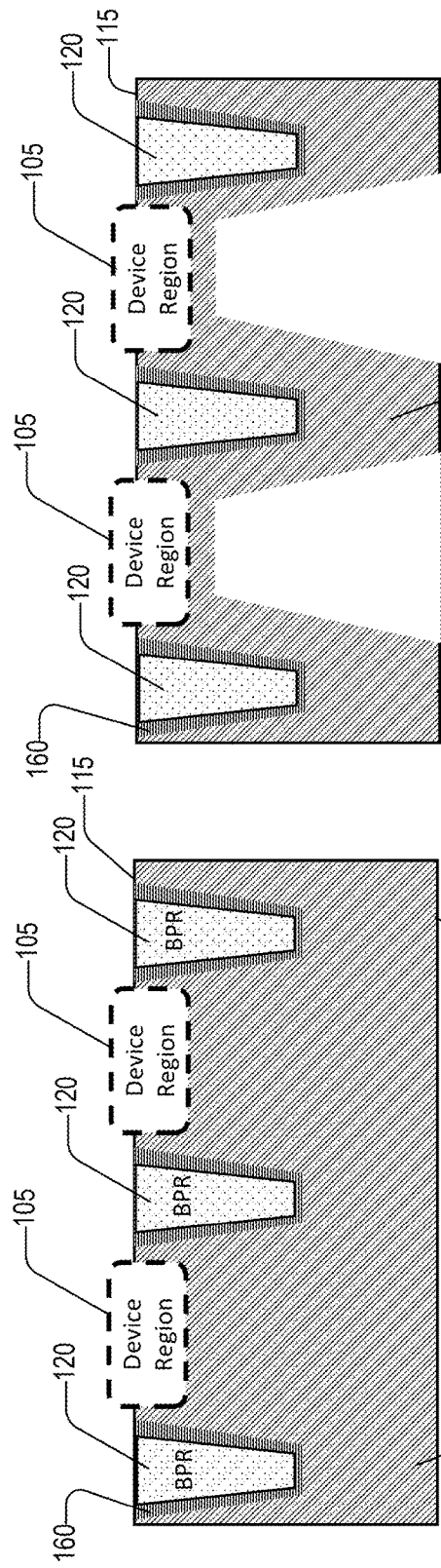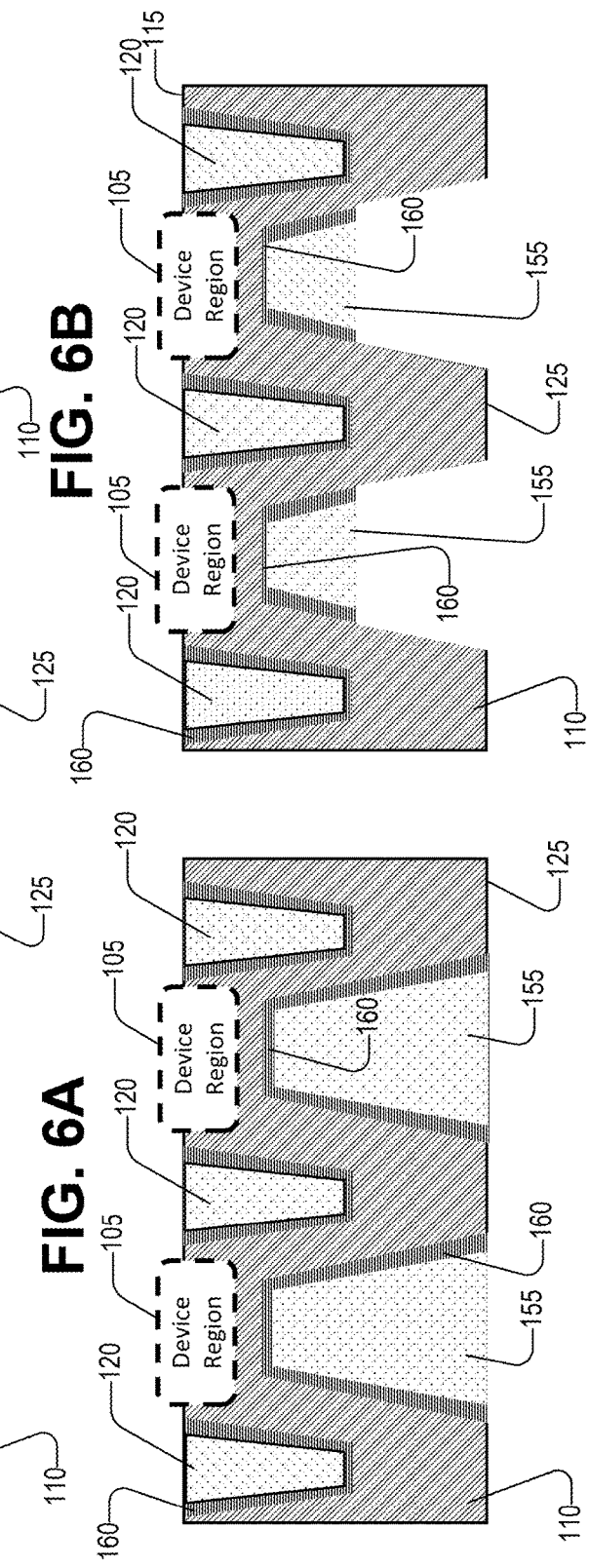

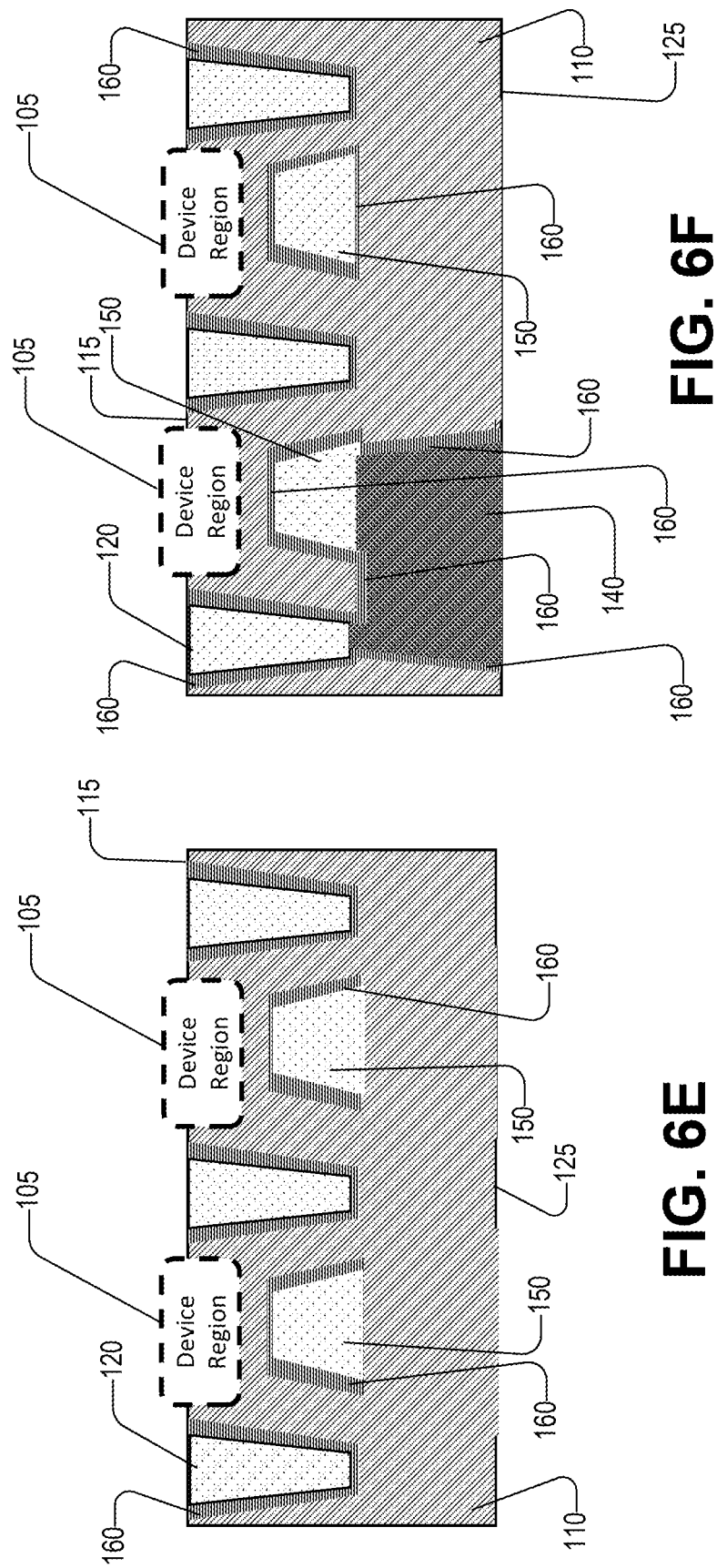

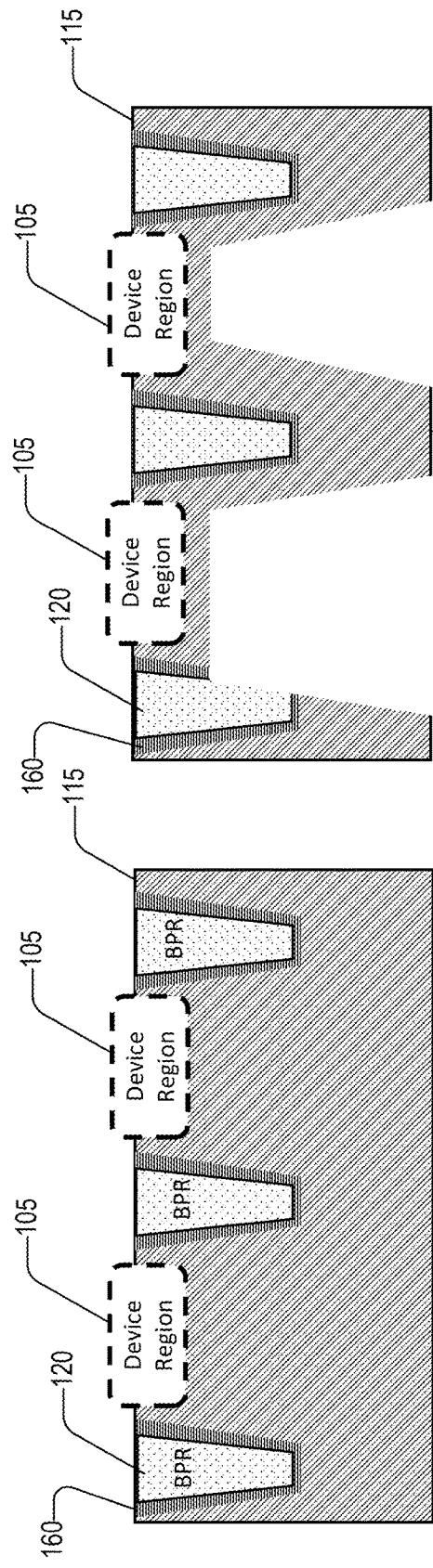
FIG. 7A
FIG. 7B
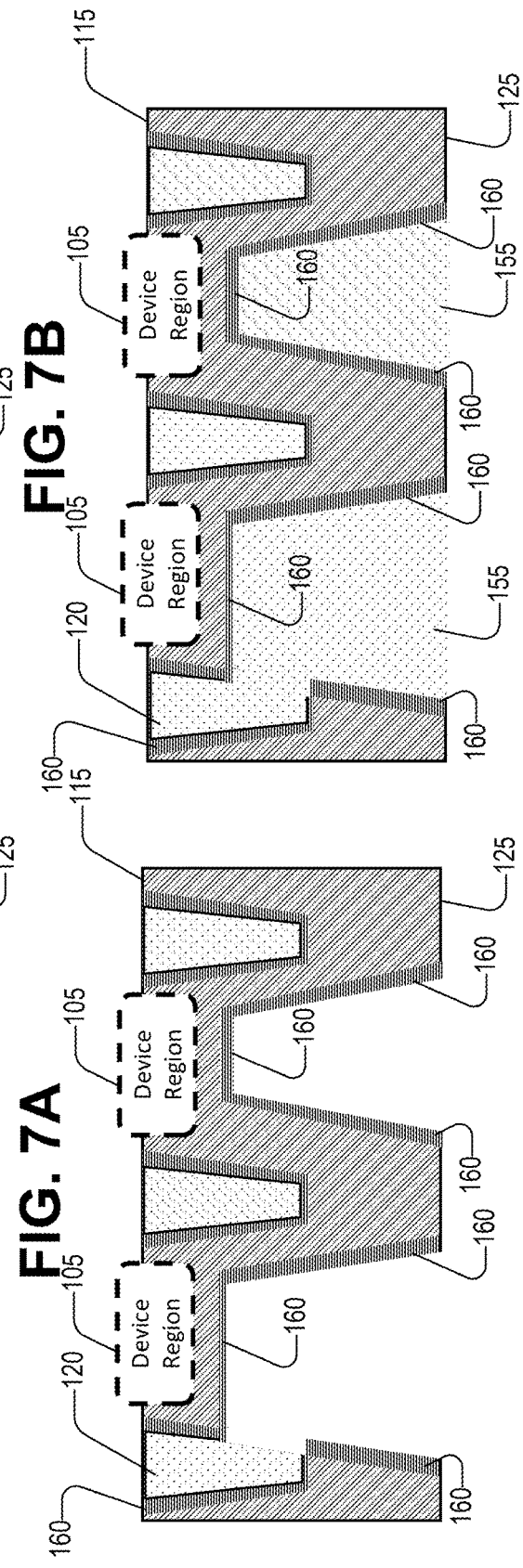
FIG. 7C
FIG. 7D

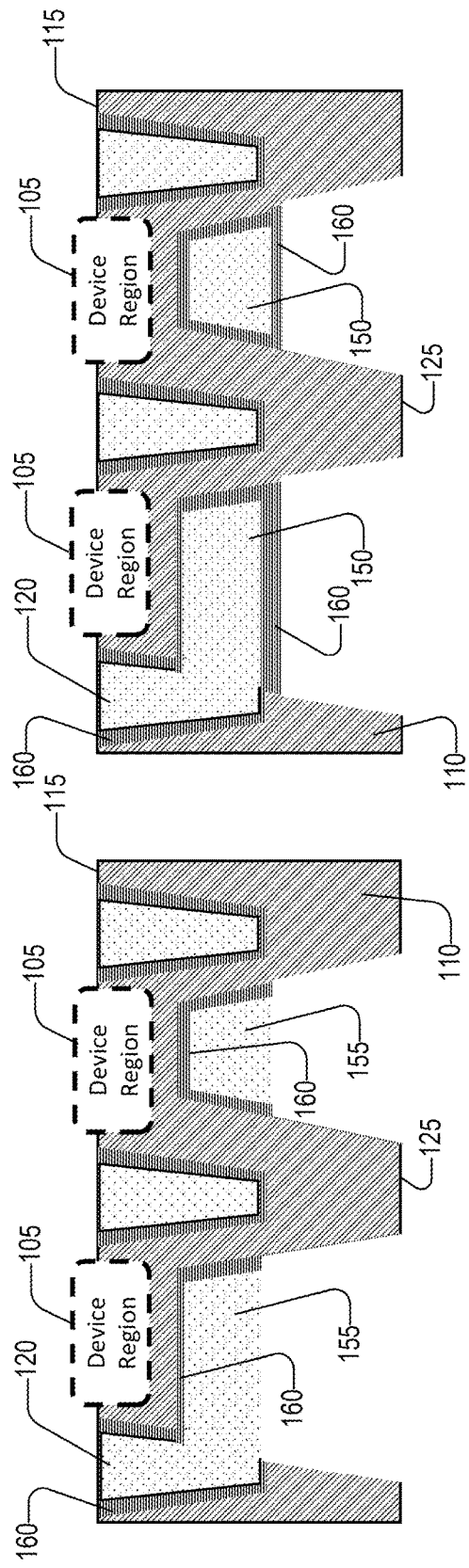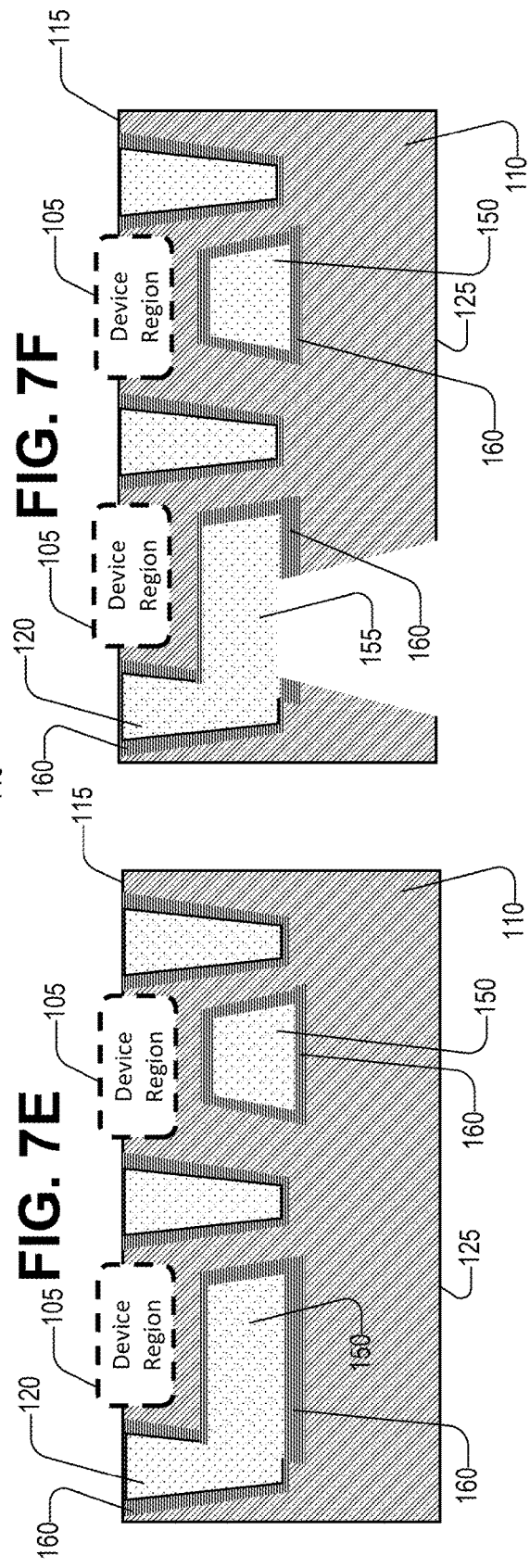

HYBRID BURIED POWER RAIL STRUCTURE WITH DUAL FRONT SIDE AND BACKSIDE PROCESSING

BACKGROUND

Technical Field

The present disclosure generally relates to electrical devices, and more particularly, to a hybrid buried power rail structure with dual front side and backside processing.

Description of the Related Art

The fabrication of processing devices becomes more challenging as the scales of devices become smaller but the processing output requirements increase. Generally, circuit designs for more powerful devices require more elements to be connected. Conventionally, designs are centered around the main processing elements. Power delivery elements are routed around the processing elements on the front side of the device. In chip manufacturing, etching and depositing material is performed from the front side of a wafer to form the processing elements. The area under device regions where the electronic processing elements are located, becomes unusable from use for any other type of element. Since formation of wafer elements is performed from the top surface down, (for example, etching, deposition, and recessing, etc.), the ability to use the intermediate areas of the wafer to form elements from the front side, under where the device regions are planned is lost because the material generally needed to support formation of the devices in the device region would be used in forming the elements in the intermediate section of the wafer.

SUMMARY

According to an embodiment of the present disclosure, a semiconductor device is provided. The device includes a semiconductor substrate. The semiconductor substrate includes a top surface and a bottom surface. An electronic device is integrated into the top surface of the semiconductor substrate. A conductive power rail is positioned intermediate the top surface and the bottom surface of the semiconductor substrate. The conductive power rail is disposed to conduct power to the electronic device.

In one embodiment, a through silicon via is connected to the conductive power rail through the bottom surface of the semiconductor substrate. As may be appreciated, the combination of features allows conductive access to the electronic device from the back side of the semiconductor substrate through the via connected to the power rail positioned in the substrate. By accessing electronics on the top surface (or front side), from the back side, more of the front side can be used for the primary electronics instead of conductive connections such as busses, jumpers, etc.

According to an embodiment of the present disclosure, a semiconductor device is provided. The device includes a semiconductor substrate. The semiconductor substrate includes a top surface and a bottom surface. An electronic device is integrated into the top surface of the semiconductor substrate. A first conductive power rail is integrated into the top surface of the semiconductor substrate. A second conductive power rail is positioned intermediate the top surface and the bottom surface of the silicon substrate.

In one embodiment, a conductive jumper is coupled to the first conductive power rail and to the second conductive power rail. With the second conductive power rail being positioned intermediate the top surface and the bottom surface of the silicon substrate, power pathways may be run in parallel (front side and back side of the device). The jumper provides electrical connections from the top surface, through the first conductive power rail, and into the substrate, through the second conductive power rail. The second conductive power rail can thus route power under device regions without interfering with the electronics. As will be appreciated, by using the back side of the device holding regions, circuit designers have more flexibility in routing power and ground lines.

According to an embodiment of the present disclosure, a method of manufacturing a power delivery system in a semiconductor device is provided. The device includes a semiconductor substrate with a top surface and a bottom surface. The top surface includes a device region for placement of one or more electronic circuit elements. The method includes etching out a region of the semiconductor substrate through the bottom surface of the semiconductor substrate. In addition, a conductive metal is deposited through the bottom surface of the semiconductor substrate, into the etched out region of the semiconductor substrate, and onto internal surfaces of the semiconductor substrate in the etched out region, to form a first type of buried power rail.

In one embodiment, a conductive through via is positioned to connect simultaneously to the first type of buried power rail that is within the substrate and to the second type of buried power rail formed through the top surface of the semiconductor substrate. In the example combination of features, power to electronics may be initially provided from the top surface through the second power rail and routed to any of the electronics from within the substrate through the first power rail. In addition, access to the line formed by the first and second power rails become accessible from the back side of the substrate when connecting any external electronics to the silicon through via.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 6A-6F are a series of diagrammatic views of steps in a process for fabricating a semiconductor device according to another illustrative embodiment.

FIGS. 7A-7J are a series of diagrammatic views of steps in a process for fabricating a semiconductor device according to another illustrative embodiment.

DETAILED DESCRIPTION

Overview

Figure 1:
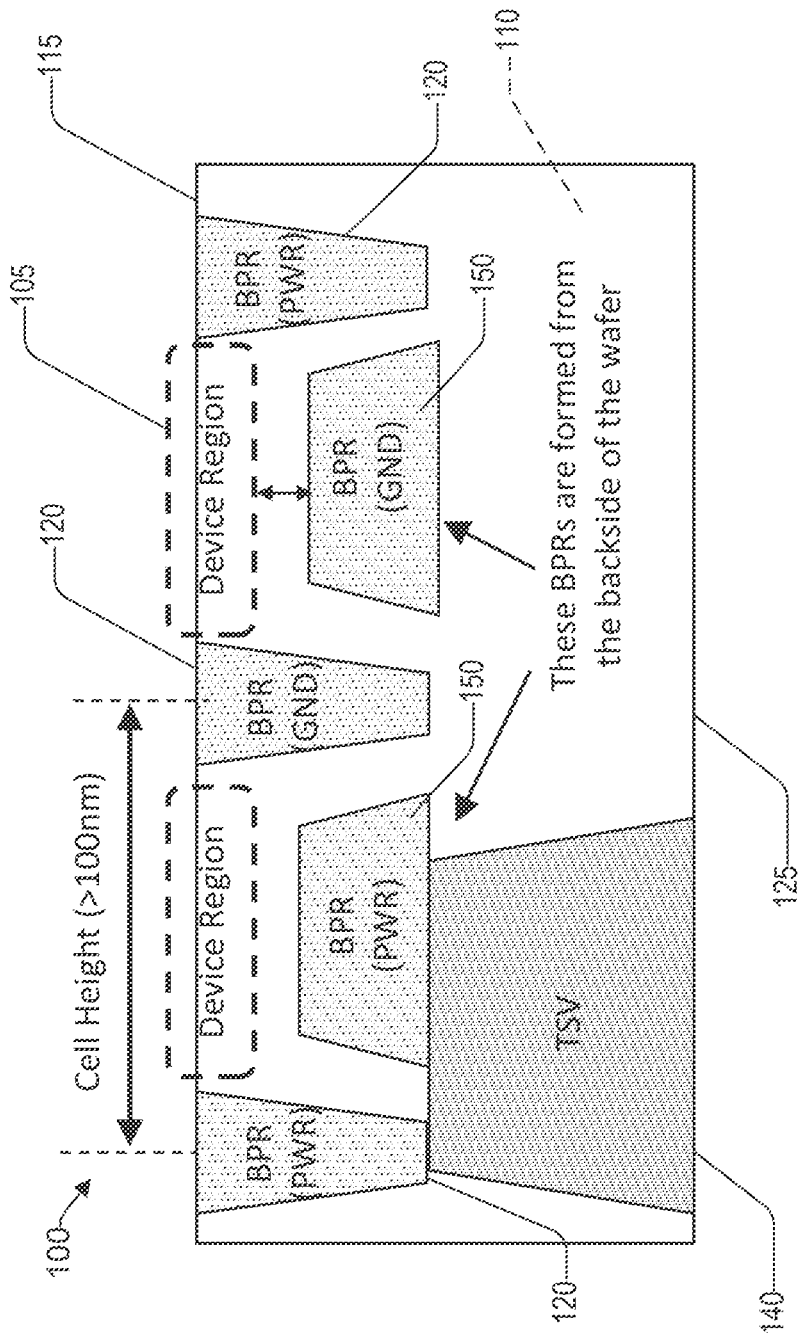
FIG. 1 is a diagrammatic, cross sectional end view of a semiconductor device according to an illustrative embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Referring to the Figures, embodiments of the subject device provide an unconventional structure for power delivery in a semiconductor device. Semiconductor devices conventionally place circuit elements on a top surface. Some examples of semiconductor devices contemplated in the scope of this disclosure include microchips, CMOS devices, transistors, and computer processing devices in general. Placement of circuit elements is typically restricted to only certain regions of a substrate to allow for inclusion of connecting pieces and margin requirements. As a result, the usable area to accommodate for the principal circuit elements is reduced to accommodate the connection between circuit elements. In an illustrative embodiment, the subject device provides buried power rails (BPR) positioned under the top surface of the substrate. Positioning the BPR's under the top surface avails previously unused substrate space for the power delivery to the circuit elements. As will be appreciated, using the area of the substrate under the top surface creates additional space for design of power delivery channels. In addition, various connection schemes can be accomplished since the area beneath the device regions become available to connect or jump together power delivery components.

Referring now to FIG. 1, a semiconductor device 100 (sometimes referred to in general as the "device 100") is shown according to an illustrative embodiment. The semiconductor device 100 includes a supporting substrate 110. In FIG. 1, cross-hatching representing the material of the substrate 110 is omitted, however can be seen in FIGS. 5A-5F, 6A-6F, and 7A-7J. The substrate 110 may compromise semiconductor material (for example silicon). In the description that follows, the substrate 110 may be interchangeably referred to as the "semiconductor substrate 110". In an illustrative embodiment, the substrate 110 may be a silicon wafer that is prepared for holding an integrated circuit. The substrate 110 includes a top surface 115 and a bottom surface 125. The substrate 110 generally supports one or more device regions 105. The device regions 105 represent areas where electrical circuit elements are positioned. For purposes of context, the device regions 105 are described as being on the "top" surface 115, which represents whatever surface on the device 100 that is normally used for circuit placement. References to the "backside" of the "device" or "substrate" may generally be interpreted as entering or accessing the substrate 110 from or through the bottom surface 125. Similarly, reference to the "front side" refers to entering or accessing the substrate 110 from or through the top surface 115.

In an illustrative embodiment, the semiconductor device 100 includes one or more BPRs 120 and one or more BPRs 150. The BPRs 120; 150 may extend into the substrate 110, thus it should be understood that FIG. 1 shows a sectional end view of the BPRs 120;150, and that a ninety-degree rotation of the device 100 would depict the BPRs 120;150 extending across the page from left to right, however not necessarily all the same length. The BPRs 150 are a first type of conductive element formed from the back surface 125 of the substrate 110. The BPRs 120 are a second type of conductive element formed generally through the top surface 115. Some embodiments include one or more through silicon vias (TSVs) 140 formed through the back surface 125. The TSVs 140 may be connected to either type BPR 120 or BPR 150. Some embodiments may position a TSV 140 in a simultaneous connection with both a BPR 120 and a BPR 150.

In some embodiments, the BPRs 120 may be power delivery lines or ground lines. The BPR 120 may be positioned adjacent the top surface 115. The BPR 120 may be exposed through the top surface 115 providing conductive access into the device interior from the exterior.

The BPR 150 is positioned below the top surface. For example, the BPR 150 may be intermediate the top surface 115 and the bottom surface 125. In some embodiments, the BPR 150 may be wholly buried in the semiconductor substrate 110 so that no part of the BPR 150 is exposed to the top surface 115 and/or the bottom surface 125. In some embodiments, the BPR 150 may be positioned under one or more of the device regions 105.

The BPR 150 makes available conductive access from the device exterior into the interior of the device 100. For example, as shown in FIG. 1, a conductive connection may be made that routes power from the device exterior to underneath a device region 105 by positioning the TSV 140 as an intermediary coupling the bottom of a BPR 120 to a BPR 150. While not illustrated in such a way, in some embodiments, the BPR 150 may be positioned adjacent the bottom surface 125 with exposure to the device exterior so that access to the device interior is provided by the BPR 150.

Figure 2:
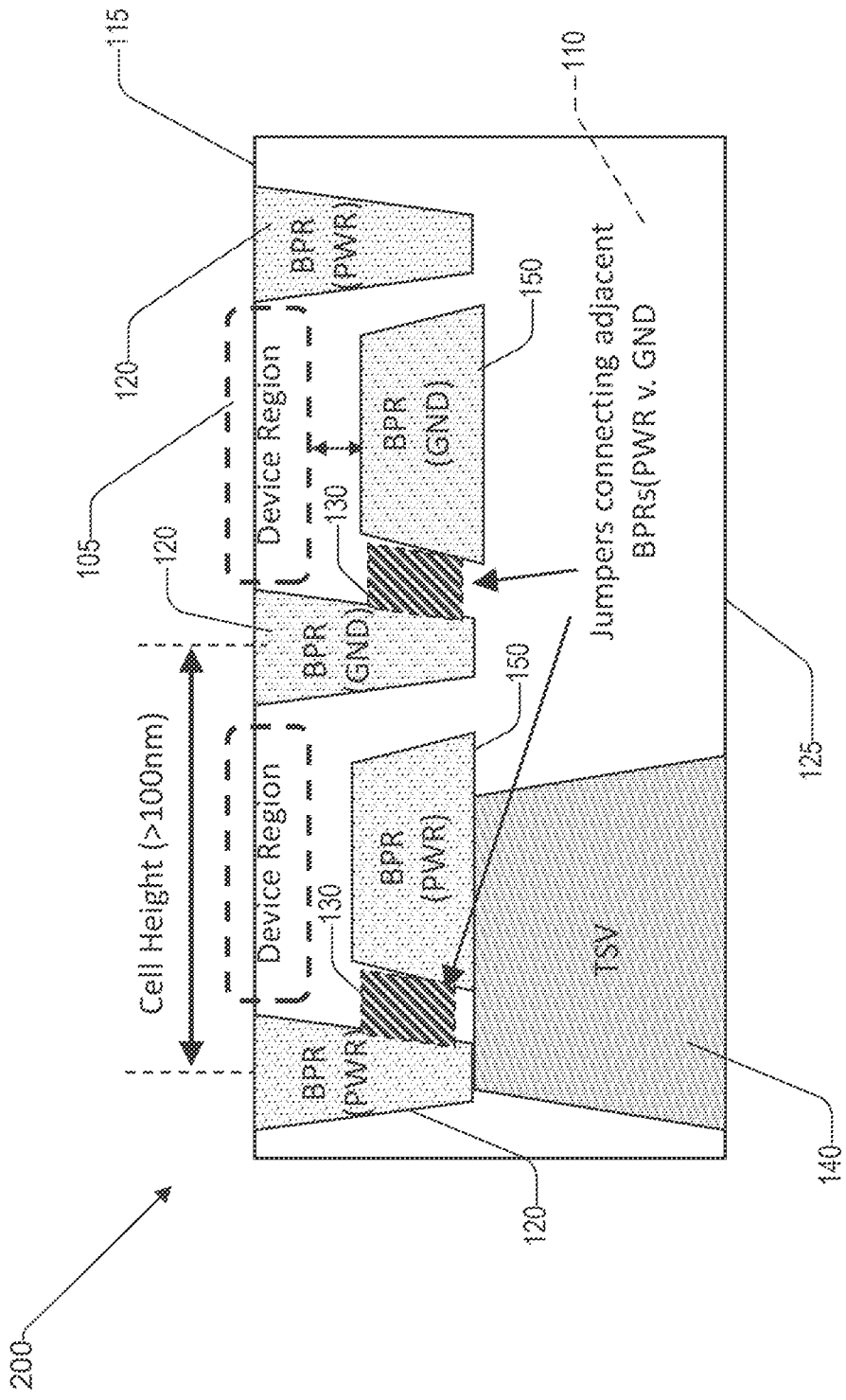
FIG. 2 is a diagrammatic, cross sectional end view of a semiconductor device according to another embodiment.
Figure 3:
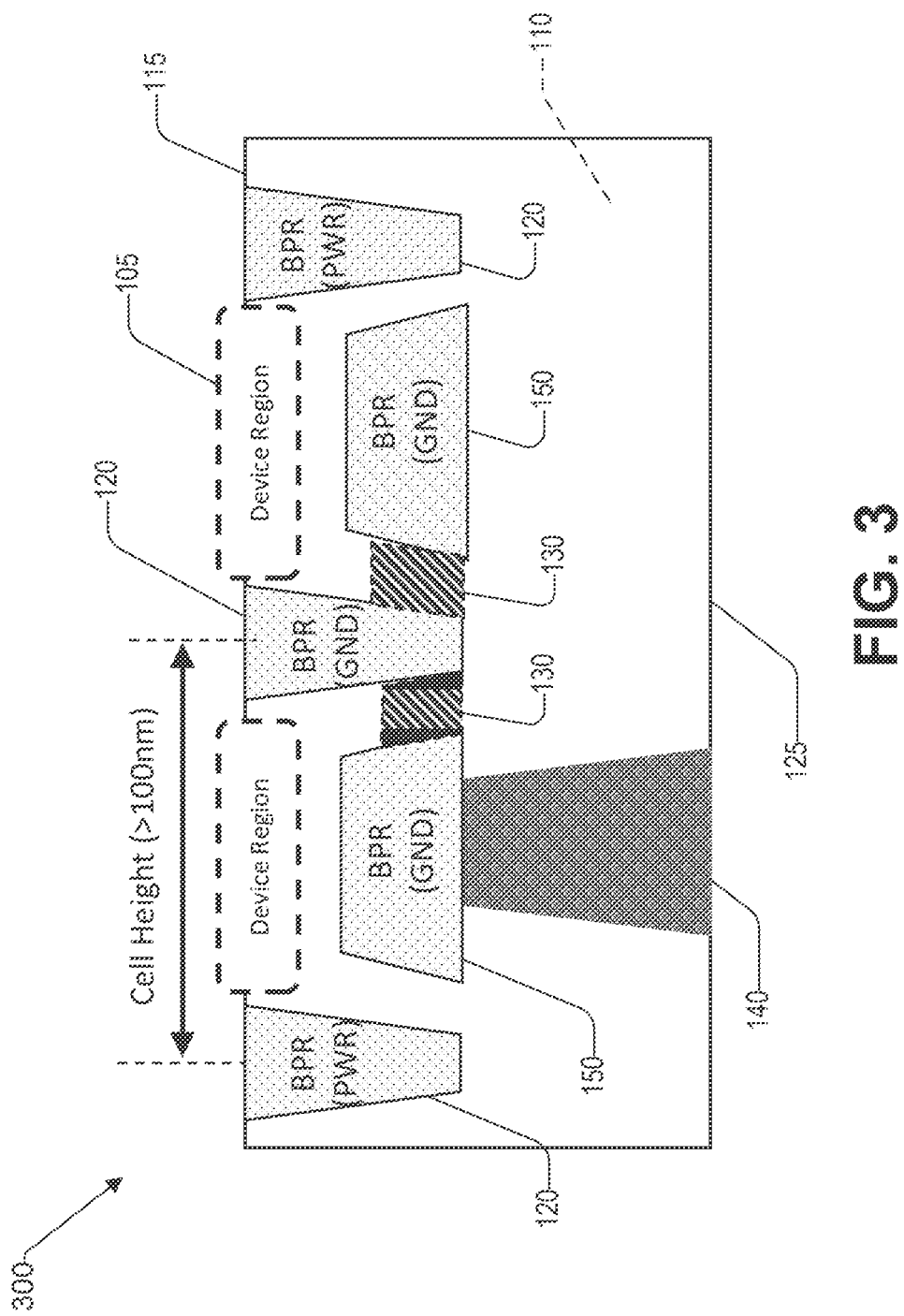
FIG. 3 is a diagrammatic, cross sectional end view of a semiconductor device according to yet another embodiment.
Figure 4:
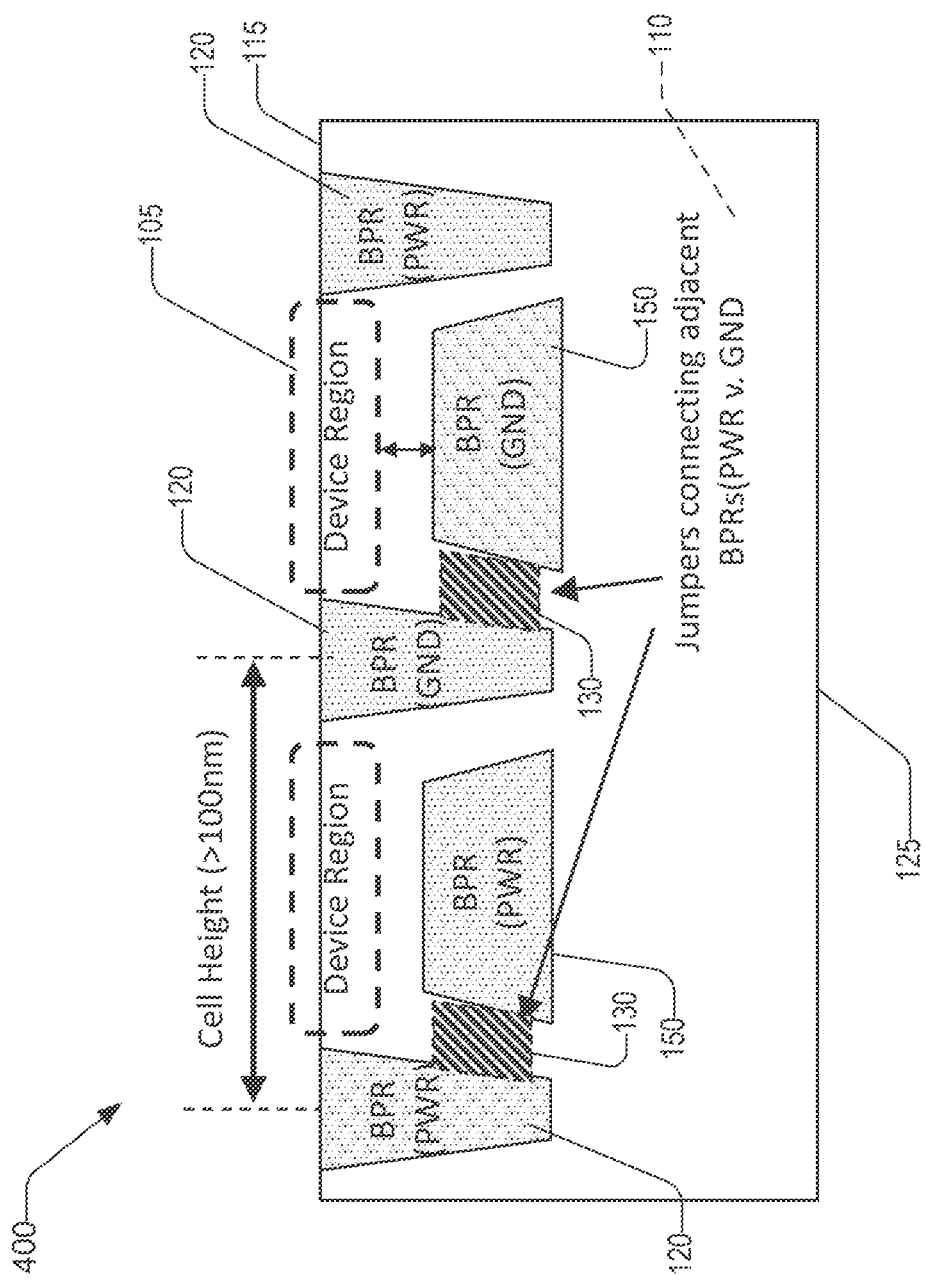
FIG. 4 is a diagrammatic, cross sectional end view of a semiconductor device according to still yet another embodiment.

The flexibility for power delivery schemes can be further seen in the embodiments shown in FIGS. 2-4. FIG. 2 shows a semiconductor device 200 that positions a conductive jumper 130 as a bridge between BPRs 120 and 150 of a same signal type (power type or ground type). For example, a jumper 130 may bridge a power line BPR 120 to a power line BPR 150. In another example, a ground line BPR 120 may be bridged to a ground line BPR 150 by a jumper 130. Access to the power delivery line may further include positioning a TSV 140 in connection to the powerline BPR 150, from the back side of the semiconductor device 200.

Instead of adjacent PWR/PWR and GND/GND, there can be three buried rails at the same voltage. For example, in one embodiment, a GND/GND/GND scheme for power-hungry device regions may be constructed using buried power rails based on the subject technologies. FIG. 3 shows an embodiment of a semiconductor device 300 that is similar to the semiconductor device 100 except that the semiconductor device 300 includes conductive jumpers 130 bridging ground type BPRs 150 to a common ground type BPR 120. In one aspect, this bridging scheme allows grounding to be shifted from the top surface 115 to the device interior providing more room for signal lines to be positioned on the top surface 115. FIG. 4 shows an embodiment of a semiconductor 400 that is similar to the embodiment in FIG. 2 except that no TSV 140 is included.

Figure 5A:
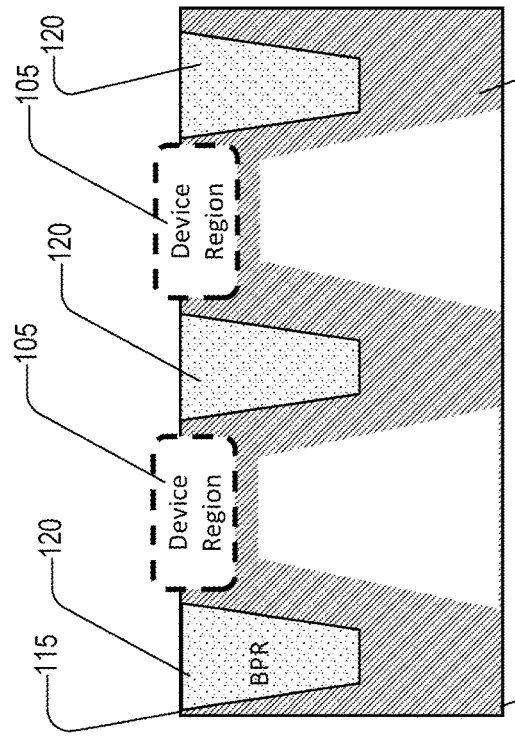
FIGS. 5A-5F are a series of diagrammatic views of steps in a process for fabricating a semiconductor device according to another illustrative embodiment.
Figure 5B:
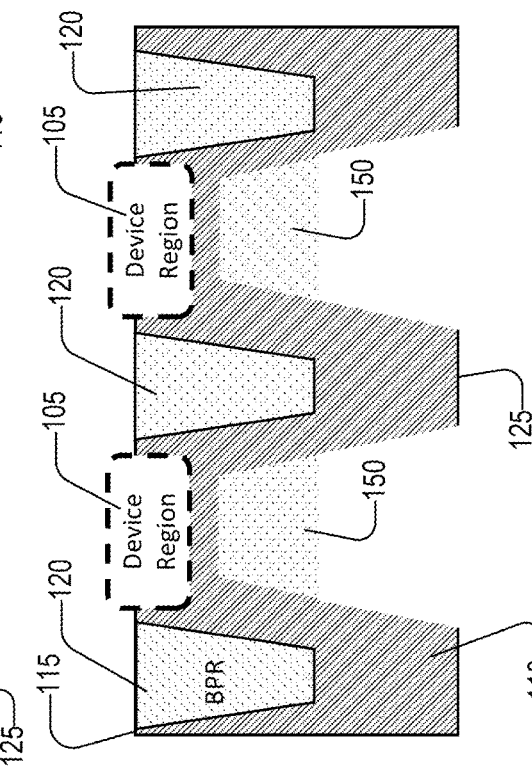
Figure 5C:
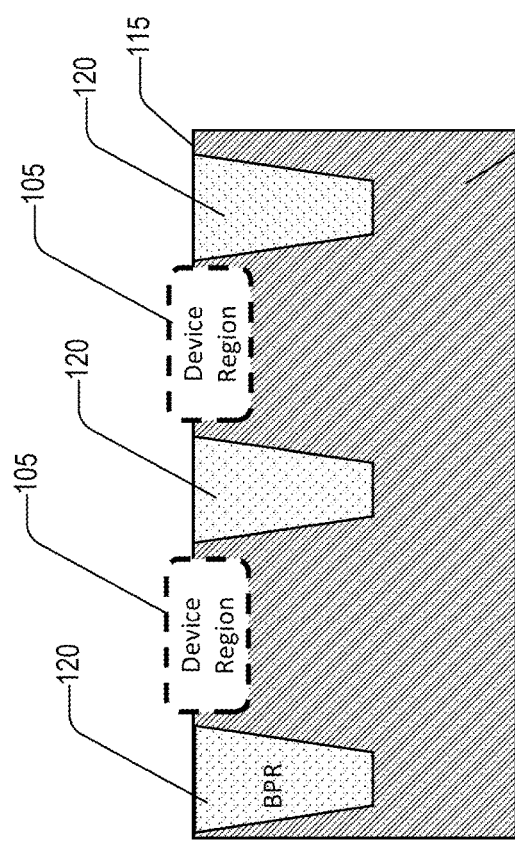
Figure 5D:
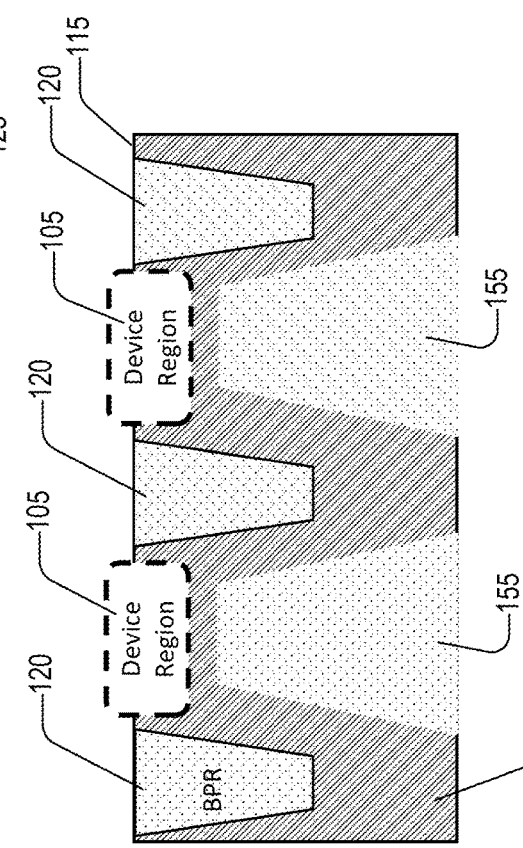
Figure 5F:
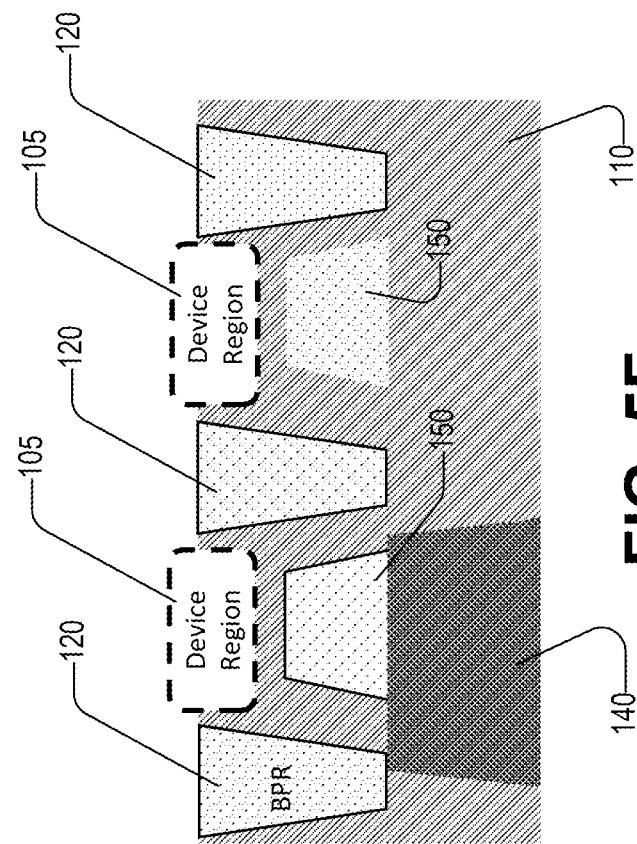
Figure 5E:
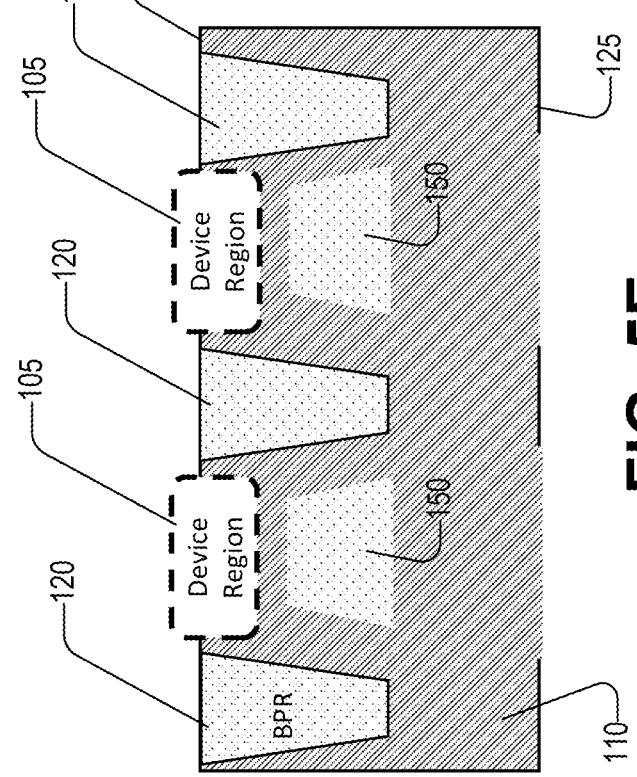

Referring now to FIGS. 5A-5F, a process of manufacturing a semiconductor device is shown according to an illustrative embodiment. The process illustrated in these figures shows one method of forming a power delivery scheme consistent with the embodiment shown in FIG. 1. It will be understood that the figures show cross-sectional views of a wafer and that elements of the drawing may have depth extending into the page. FIG. 5A shows a wafer (substrate 110) of silicon or other semiconductor material prepared with two device regions 105, two BPRs 120 on the edges of the substrate 110 and on the outside of the device regions 105, and a BPR 120 positioned in between the device regions 105. FIG. 5B shows a step that includes etching out areas of the substrate 110 below the device regions 105 from the backside of the wafer (through bottom surface 125). FIG. 5C shows a step of filling in the etched-out areas with a metal (for example, the same metal as used for the BPR 120). The deposited metal and its final shape will result in the BPR 150. One example of a metal used for forming a BPR is ruthenium. While FIG. 5C shows that the metal is deposited so that the entire etched out region is filled all the way to the bottom surface 125, in some embodiments, the depth of deposit may be controlled. FIG. 5D shows a step that includes etching away from the back side of the wafer (bottom surface 125), a portion of the metal previously filled in FIG. 5C. The amount of metal removed may depend on the profile wanted for the resultant power rail. In some embodiments, metal is not necessarily removed so that the resultant BPR is exposed through the back surface 125. FIG. 5E shows a step of depositing silicon (backfilling), into the empty area from the backside of the wafer left behind from the metal removed in FIG. 5D. In some embodiments chemical metallized polishing (CMP) is performed on the bottom surface 125 after the backfill is performed. The metallized regions that remain under the top surface 115 and covered by the backfill step are the BPRs 150.

Referring now to FIGS. 6A-6F, a process for manufacturing a semiconductor device is shown according to another illustrative embodiment. The process shown in FIGS. 6A-6F is similar to the process shown in FIGS. 5A-5F except that the steps of depositing a dielectric layer 160 on selected surfaces of the elements fabricated from the backside of the wafer are included. For example, FIGS. 6A and 6B show the same steps performed in FIGS. 5A and 5B (but the metallization of the BPRs 120 is protected by a dielectric layer 160). At FIG. 6C, the process is similar to the step shown in FIG. 6C except that prior to filling the empty region with a metal 155, a dielectric layer 160 (for example, silicon nitride) is deposited onto the internal surfaces of the substrate 110 (which may be shaped by a shallow trench isolation pattern). In FIG. 6D, the drawing represents a step of recessing the metal 155 and dielectric layer 160 away from the back surface 125 until a profile of the BPR 150 is achieved. The step leaves an empty region from the bottom border of the deposited metal 155 to the back surface 125.

FIG. 6E shows a step of depositing silicon into the empty region that resulted in FIG. 6D. Since the back filling material may be the same as the original substrate material, the back filled silicon and substrate are both represented by the reference numeral 110. The metal that is surrounded by the silicon is the BPR 150.

FIG. 6F shows an aggregation of steps that includes etching away a section of the silicon under a BPR 120 and an adjacent BPR 150, through the back surface 125. After etching, another layer of dielectric material is deposited around the perimeter of the etched out surfaces, except for where there is BPR metal. A TSV 140 is formed (using for example, copper) that short circuits or connects the BPR 120 and the BPR 150. The BPR 150 on the right side may be encapsulated by dielectric material by etching away silicon under the BPR metal and depositing the dielectric layer 160 on the bottom boundary of the BPR 150 before silicon is backfilled into the empty area under the BPR 150.

Figure 7I:
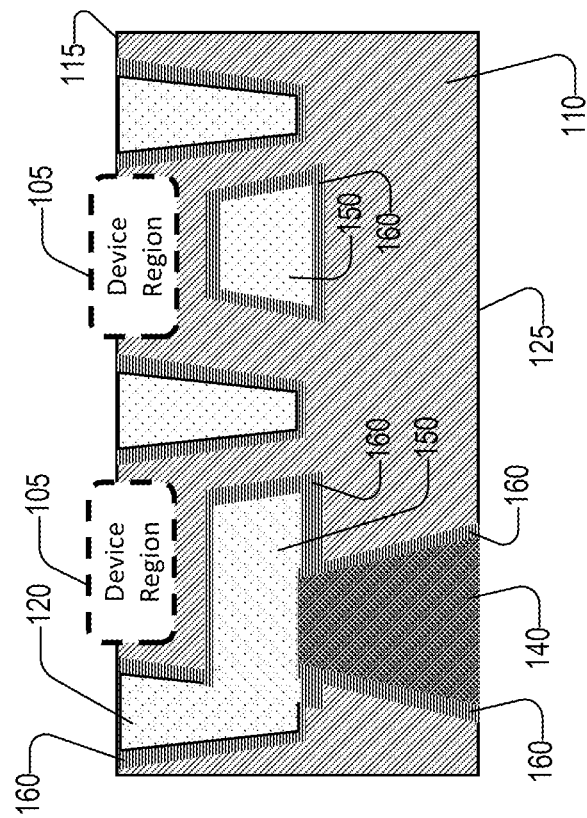

FIGS. 7A-7J show a process for manufacturing a semiconductor device according to another illustrative embodiment. The step shown in FIG. 7A is the same step of initial top surface formation of BPRs 120 at cell boundaries, shown in FIG. 6A.

FIG. 7B shows a step of etching away at the substrate 110 from the back surface 125 at a depth extending past the bottom boundaries of the BPRs 120. One of the etched out areas removes some of the dielectric material bounding the left hand BPR 120 on its right side. The other two BPRs 120 may be untouched by the etching process.

FIG. 7C shows a step representing selective deposition of a dielectric layer 160 onto surfaces outlining the empty, etched out areas of the substrate 110 that resulted from the step shown in FIG. 7B. In one embodiment, the metal surface of the BPR 120 exposed by the etching step of FIG. 7B does not receive the dielectric material. The step in FIG. 7C may be performed by using Self-Assembled Monolayers (SAM) materials for metal protection or using FAV-like (fully aligned via) chemistry for selective deposition. FAV-like chemistry provides for example, dielectric material selectively deposited everywhere except for an exposed metal surface.

FIG. 7D shows a step of depositing metal 155 (which may be the same metal as the BPR 120) filling in the etched out areas in the substrate 110. The deposited metal 155 and dielectric layers 160 may extend from the distal boundary of the area etched out in FIG. 7B to the bottom surface 125.

FIG. 7E shows a step of recessing the metal 155 and dielectric layer 160 back into the substrate 110. In one embodiment, the recess process may remove the metal 155 and dielectric layer 160 to the level of the bottom boundary of the BPR 120 on the left side of the device. Empty regions are left behind in the substrate 110 from where the recess process was performed.

FIG. 7F shows a step of depositing a dielectric layer 160 on exposed surfaces of the metal (for example, the bottom boundaries) that remain from the recess process of FIG. 7E. The result provides dielectrically encapsulated BPRs 120 and 150. In addition, as can be seen, the BPR 120 on the left becomes merged with (or jumped to) the BPR 150 on the left.

FIG. 7G shows a step of back-filling silicon into the empty regions below the BPRs 150. FIG. 7H shows a step of etching a section of the silicon under the BPR 120/150 element on the left for formation of a via.

FIG. 7I shows a step of depositing dielectric material on the sidewall(s) of the empty section of the substrate 110 defining the via.

Figure 7J:
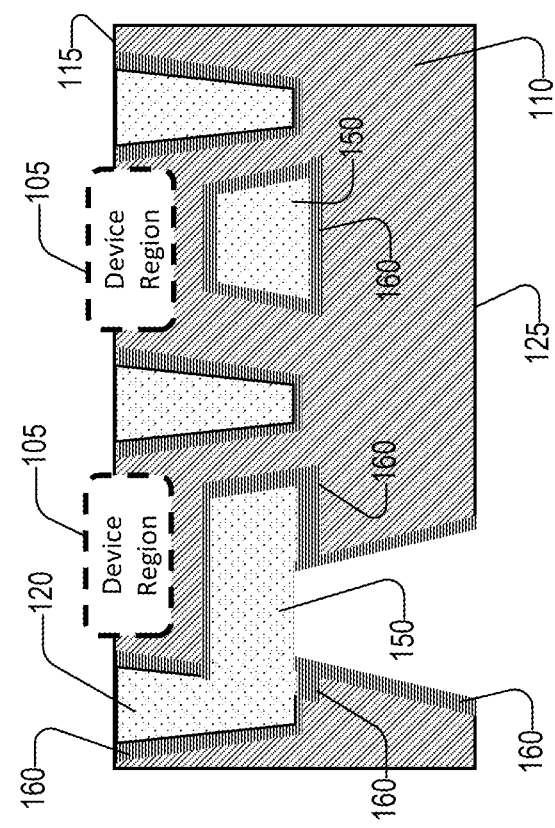

FIG. 7J shows a step of depositing metal over the dielectric material on sidewalls of the via 140 to form a TSV that accesses the BPR 120/150 element from the back surface 125.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
    a semiconductor substrate having a top surface and a bottom surface;
    an electronic device integrated into the top surface of the semiconductor substrate; and
    one or more conductive power rails positioned below the electronic device such that a footprint of the electronic device overlaps a footprint of the one or more conductive power rails.

2. The semiconductor device of claim 1, further comprising:
    a through silicon via extends from the bottom surface through the semiconductor substrate and directly contacts a bottom surface of at least one of the one or more conductive power rails.

3. The semiconductor device of claim 1, further comprising:
    a conductive jumper directly contacting a sidewall of at least one of the one or more conductive power rails.

4. The semiconductor device of claim 3, wherein the conductive jumper is positioned below the electronic device.

5. The semiconductor device of claim 1, wherein the one or more conductive power rails are buried inside the semiconductor substrate.

6. A semiconductor device, comprising:
    a semiconductor substrate having a top surface and a bottom surface;
    an electronic device integrated into the top surface of the semiconductor substrate;
    a first conductive power rail integrated into the top surface of the semiconductor substrate; and
    a second conductive power rail positioned below the electronic device, and wherein a bottom surface of the first conductive power rail is below a top surface of the second conductive power rail.

7. The semiconductor device of claim 6, further comprising:
    a through silicon via extending through the semiconductor substrate and directly contacting a bottom surface of the second conductive power rail.

8. The semiconductor device of claim 6, further comprising:
    a through silicon via extending through the semiconductor substrate and directly contacting both a bottom surface of the first conductive power rail and a bottom surface of the second conductive power rail.

9. The semiconductor device of claim 6, further comprising:
    a conductive jumper directly contacting both a sidewall of the first conductive power rail and a sidewall of the second conductive power rail.

10. The semiconductor device of claim 9, wherein the conductive jumper is positioned intermediate the electronic device and above the bottom surface.

11. The semiconductor device of claim 6, wherein the second conductive power rail is positioned intermediate the electronic device and above the bottom surface.

12. The semiconductor device of claim 6, wherein a height of the first conductive power rail is greater than a height of the second conductive power rail.

13. The semiconductor device of claim 6, further comprising:
    a conductive jumper directly contacting both a sidewall of the first conductive power rail and a sidewall of the second conductive power rail.

14. A semiconductor device comprising:
    a semiconductor substrate having a top surface and a bottom surface;
    an electronic device integrated into the top surface of the semiconductor substrate;
    a first conductive power rail integrated into the top surface of the semiconductor substrate; and
    a second conductive power rail positioned below the electronic device, and wherein a sidewall of the first conductive power rail directly contacts a sidewall of the second conductive power rail.

15. The semiconductor device of claim 14, further comprising:
    a through silicon via extending through the semiconductor substrate and directly contacting a bottom surface of the second conductive power rail.

16. The semiconductor device of claim 14, further comprising:
    a through silicon via extending through the semiconductor substrate and directly contacting both a bottom surface of the first conductive power rail and a bottom surface of the second conductive power rail.

17. The semiconductor device of claim 14, wherein the second conductive power rail is positioned intermediate the electronic device and above the bottom surface.

18. The semiconductor device of claim 14, wherein a height of the first conductive power rail is greater than a height of the second conductive power rail.

* * * * *